(12) United States Patent
Zhang

(10) Patent No.: US 10,614,988 B2
(45) Date of Patent: Apr. 7, 2020

(54) PACKAGE STRUCTURE OF DISPLAY PANEL, CONNECTING BOARD, PACKAGE METHOD AND DISPLAY DEVICE

(71) Applicant: BOE TECHNOLOGY GROUP CO., LTD., Beijing (CN)

(72) Inventor: Bo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 15/535,894

(22) PCT Filed: Mar. 1, 2016

(86) PCT No.: PCT/CN2016/075191
§ 371 (c)(1),
(2) Date: Jun. 14, 2017

(87) PCT Pub. No.: WO2017/045372
PCT Pub. Date: Mar. 23, 2017

(65) Prior Publication Data
US 2017/0338074 A1    Nov. 23, 2017

(30) Foreign Application Priority Data

Sep. 16, 2015   (CN) .......................... 2015 1 0590867

(51) Int. Cl.
*H01J 11/46*   (2012.01)
*H01L 23/488*   (2006.01)
(Continued)

(52) U.S. Cl.
CPC ............ *H01J 11/46* (2013.01); *G02F 1/1345* (2013.01); *G02F 1/13452* (2013.01);
(Continued)

(58) Field of Classification Search
CPC combination set(s) only.
See application file for complete search history.

(56) References Cited

U.S. PATENT DOCUMENTS 5,822,030 A * 10/1998 Uchiyama ........... G02F 1/13452
                                                     349/149
5,893,623 A    4/1999 Muramatsu
(Continued)

FOREIGN PATENT DOCUMENTS

CN    1135798 A    11/1996
CN    1753160 A    3/2006
(Continued)

OTHER PUBLICATIONS

Second Chinese Office Action in Chinese Application No. 201510590867.1, dated Jan. 3, 2018 with English translation.
(Continued)

*Primary Examiner* — Lauren Nguyen
(74) *Attorney, Agent, or Firm* — Collard & Roe, P.C.

(57) ABSTRACT

Provided are a package structure, adaptor board, and packaging method of a display panel, and display device. A package structure of a display panel includes: the display panel, a chipset configured to control the display panel, and an adaptor board, wherein the chipset is located over the display panel, and the adaptor board is located between the chipset and the display panel. A protrusion at a side of the adaptor board facing the display panel has a gold surface. Package pins of respective chips in the chipset are electrically connected to the display panel via the adaptor board.

18 Claims, 2 Drawing Sheets

(51) Int. Cl.
  *H01L 23/49* (2006.01)
  *G02F 1/1345* (2006.01)
  *H01L 51/52* (2006.01)
  *H01J 11/12* (2012.01)
  *H01L 27/32* (2006.01)

(52) U.S. Cl.
  CPC ............ *H01L 23/488* (2013.01); *H01L 23/49* (2013.01); *H01L 51/524* (2013.01); *H01J 11/12* (2013.01); *H01L 27/3225* (2013.01)

(56) References Cited

U.S. PATENT DOCUMENTS

| | | | |
|---|---|---|---|
| 6,111,628 A * | 8/2000 | Shiota | G02F 1/13452 257/E21.511 |
| 6,556,268 B1 | 4/2003 | Lee et al. | |
| 2008/0191335 A1 | 8/2008 | Yang et al. | |
| 2010/0171216 A1 | 7/2010 | Tanaka | |
| 2015/0295332 A1 * | 10/2015 | Shedletsky | H01R 12/613 439/83 |

FOREIGN PATENT DOCUMENTS

| | | |
|---|---|---|
| CN | 101533816 A | 9/2009 |
| CN | 102683309 A | 9/2012 |
| CN | 105261602 A | 1/2016 |
| JP | 2007-108537 A | 4/2007 |
| JP | 4907144 B2 | 3/2012 |

OTHER PUBLICATIONS

International Search Report of PCT/CN2016/075191 in Chinese, dated Jun. 20, 2016 with English translation.
Notice of Transmittal of the International Search Report of PCT/CN2016/075191 in Chinese, dated Jun. 20, 2016.
Written Opinion of the International Searching Authority of PCT/CN2016/075191 in Chinese, dated Jun. 20, 2016 with English translation.
Chinese Office Action in Chinese Application No. 201510590867.1 with English translation, dated Jul. 11, 2017.

* cited by examiner

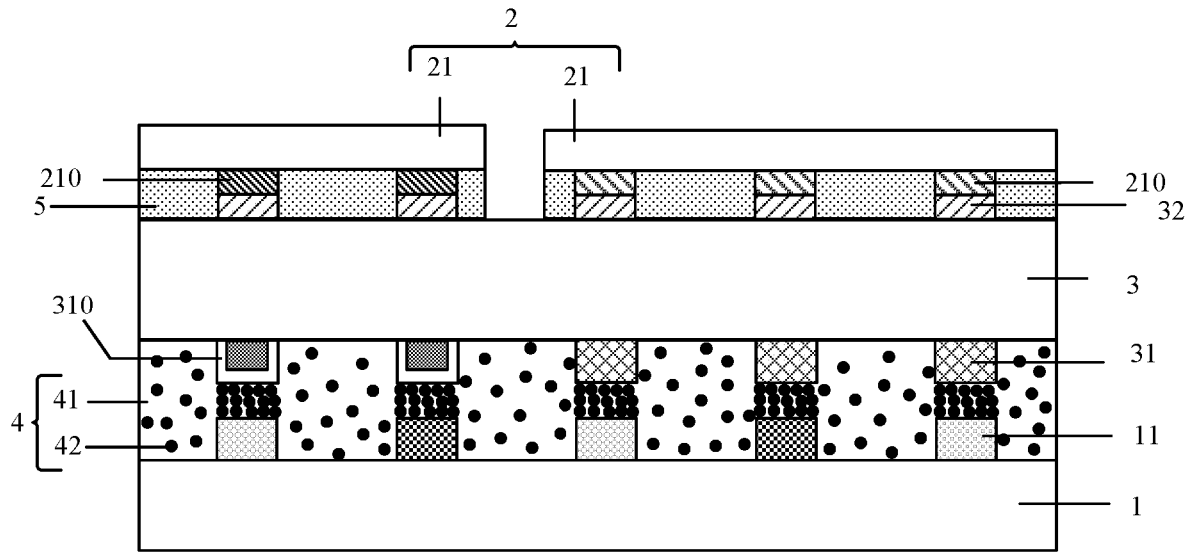

FIG. 1 electrically connecting a first side of an connecting board with package pins of respective chips in a chipset configured for controlling the display panel by a reflow soldering process — S201 electrically connecting a second side of the connecting board opposite to the first side with the display panel by a chip on glass packaging process, wherein, a material of a surface of a convex spot on the second side of the connecting board is of gold — S202

FIG. 2

PACKAGE STRUCTURE OF DISPLAY PANEL, CONNECTING BOARD, PACKAGE METHOD AND DISPLAY DEVICE

CROSS REFERENCE TO RELATED APPLICATIONS

This application is the National Stage of PCT/CN2016/075191 filed on Mar. 1, 2016, which claims priority under 35 U.S.C. § 119 of Chinese Application No. 201510590867.1 filed on Sep. 16, 2015, the disclosure of which is incorporated by reference.

TECHNICAL FIELD

Embodiments of the present disclosure relate to a package structure of a display panel, a connecting board, a package method and a display device.

BACKGROUND

Along with development of an electronics and communications industry, demand for a Light Emitting Diode (LED), an Organic Light Emitting Diode (OLED), a Plasma Display Panel (PDP), a Liquid Crystal Display (LCD) and other flat panel display devices increases day by day. A development tendency of the flat panel display devices is lightness, thinness, shortness and smallness, a packaging technology with characteristics of high density, small volume, high installing freedom degree and the like is needed to meet above requirements, and thus, a Chip on Glass (COG) packaging technology emerges.

According to a COG, a driving chip is fixed to a display panel, the display panel is applied to serve as a carrier for packaging the driving chip, and a package pin on the driving chip is electrically connected with a corresponding package pin on the display panel by using an Anisotropic Conductive Film (ACF) in a pressing connection manner.

SUMMARY

An embodiment of the present disclosure provides a package structure of a display panel, including: a display panel, a chipset configured for controlling the display panel, and an connecting board, wherein, the chipset is located above the display panel, and the connecting board is located between the chipset and the display panel; a surface of a convex spot on a side of the connecting board facing the display panel is of gold; and package pins of respective chips in the chipset are electrically connected with the display panel through the connecting board.

In an example, the connecting board is a through silicon via connecting board.

In an example, the package structure further includes: an anisotropic conductive film located between the connecting board and the display panel, and the connecting board is electrically connected with the display panel through the anisotropic conductive film.

In an example, the package structure further includes: bottom filler filled in at least part of a region between the connecting board and the chipset.

In an example, an overall material of a convex spot on the side of the connecting board facing the display panel is of gold.

Another embodiment of the present disclosure provides a display device, including the package structure of the above display panel.

Still another embodiment of the present disclosure provides a connecting board, wherein a surface of a convex spot on at least one side of the connecting board is of gold.

In an example, an overall material of a convex spot is of gold.

Yet another embodiment of the present disclosure provides a package method of a display panel, including: electrically connecting a first side of an connecting board with package pins of respective chips in a chipset configured for controlling the display panel, by a reflow soldering process; and electrically connecting a second side of the connecting board with the display panel by a chip on glass packaging process, wherein, a surface of a convex spot on the second side of the connecting board is of gold.

In an example, the electrically connecting the second side of the connecting board with the display panel by the chip on glass packaging process is executed as: forming an anisotropic conductive film on the second side of the connecting board; or forming an anisotropic conductive film on a side of the display panel facing the connecting board; and electrically connecting the connecting board with the display panel through the anisotropic conductive film by a hot-pressing process.

In an example, after electrically connecting a first side of an connecting board with package pins of respective chips in a chipset configured for controlling the display panel, by a reflow soldering process, the package method further includes: filling bottom filler between the connecting board and the chipset.

BRIEF DESCRIPTION OF THE DRAWINGS

In order to clearly illustrate technical solutions of the embodiments of the disclosure, drawings of the embodiments will be introduced simply, and it is obvious that the described drawings only relate to some of the embodiments of the present disclosure, but are not limitative of the present disclosure.

FIG. 1 is a sectional schematic diagram of a package structure of a display panel provided by an embodiment of the present disclosure;

FIG. 2 is a flow diagram of a package method of the package structure of the display panel provided by an embodiment of the present disclosure.

DETAILED DESCRIPTION

Figure 3A:
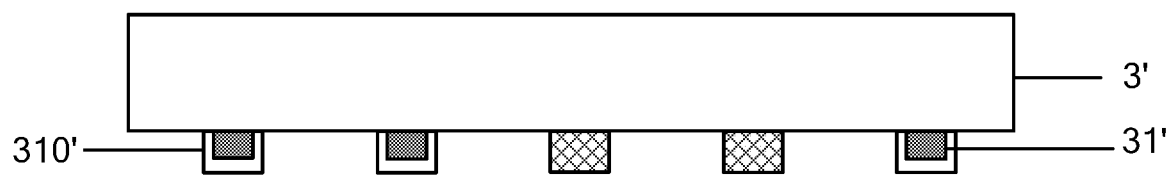
FIGS. 3a and 3b are respectively sectional schematic diagrams of a connecting board provided by an embodiment of the present disclosure.

As well known, a plurality of chips such as a driving chip, a power source chip, a storage chip and the like need to be arranged in a peripheral circuit to make a display panel display. But in a current display panel package structure, only the driving chip can be arranged on the display panel by using a COG packaging technology, and the other chips, due to the design of package pins, are not suitable for being arranged on the display panel by using the COG packaging technology. In a related art, there are two following methods for arranging the other chips on the display panel. One method is that design of the package pins of all the other chips is changed, so that the other chips can also be arranged on the display panel by using the COG packaging technology, but actually, many other chips and devices, except the driving chip, in the display panel are also needed, different chips are all produced by different manufacturers, and redesign of all the chips certainly causes great process difficulty and cost rise. The other method is that a hot reflux process is adopted to make the other chips electrically connected with the display panel. But a temperature of the hot reflux process generally ranges from 220° to 260°, while a highest tolerable temperature of the display panel is 80°-90°, and thus performance of the whole display panel will be damaged when the hot reflux process is adopted. Thus, the two methods are not suitable for arranging the other chips on the display panel to perform large-scale integrated mass production.

In order to clearly illustrate purposes, technical solutions and advantages of the embodiments of the disclosure, the technical solutions of the embodiments of the present disclosure will be described in a clearly and fully understandable way in connection with the drawings in the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, technical terms or scientific terms used herein should have common sense understood by persons with general skills in the field to which the present disclosure belongs. "First" "second" and similar words used in a specification and claims of the present disclosure do not show any order, number or importance and are only used for distinguishing different components. Similarly, "a/an" or "one" and other similar words do not show number limitation, either, but show that at least one exists. "Include" or "contain" and other similar words refer to elements or articles appearing before "include" or "contain" and cover enumerative elements or articles and equivalents thereof appearing after "include" or "contain", and other elements or articles are not excluded. "Connection" or "linkage" and other similar words are not limited to physical or mechanical connection, but can include electrical connection, whether direct connection or indirect connection. "Upper" "lower" "left" "right" and the like are only used for showing a relative position relationship, and after an absolute position of a described object is changed, the relative position relationship can also be correspondingly changed.

Embodiments of the present disclosure provide a package structure of a display panel, a connecting board, a package method and a display device; after the connecting board having a convex with gold surface on a side thereof is used to be electrically and mechanically connected and packaged with respective chips in a chipset of the display panel, the connecting board with the chipset provided thereon is overall arranged onto the display panel by adopting a COG packaging technology, and the method is more applicable to arranging the respective chips in the chipset configured for controlling the display panel on the display panel and performing large-scale mass production.

In the drawings, thicknesses and shapes of the respective film layers do not reflect true proportion of the package structure of the display panel and the connecting board provided by the embodiments of the present disclosure and only aim at schematically showing related technical content.

An embodiment of the present disclosure provides a package structure of a display panel, as shown in FIG. 1, including: a display panel 1, a chipset 2 configured for controlling the display panel, and an connecting board 3. The chipset 2 is located above the display panel 1, the connecting board 3 is located between the chipset 2 and the display panel 1; a surface 310 of a convex spot 31 on a side of the connecting board 3 facing the display panel 1 is of gold; package pins 210 of respective chips 21 in the chipset 2 are electrically connected with the display panel 1 through the connecting board 3. For example, the package pins 210 of the respective chips 21 in the chipset 2 are electrically connected with package pins 11 of the display panel 1 through the connecting board 3. The package pins 11 of the display panel 1, generally arranged in a peripheral region of the display panel 1 and corresponding to respective signal lines in the display panel, are configured for transmitting signals from the chips to the signal lines in the display panel through the package pins. The signal lines of the display panel can be of various kinds and are respectively connected with chips with different functions, and all existing achievable manners can be adopted for a corresponding connection relationship of the signal lines and the chips, which will not be repeated herein.

In the package structure of the above display panel provided by the embodiment of the present disclosure, the chipset is located above the display panel, the package pins of respective chips in the chipset are electrically connected with the display panel through the connecting board. Because the package pins of the respective chips in the chipset are electrically connected with the connecting board directly, damage to the display panel caused by high temperature generated when the package pins of respective chips in the chipset are electrically connected with the display panel directly is avoided; because the surface of the convex spot on the side of the connecting board facing the display panel is of gold which has good characteristics of high conductivity, high temperature resistance, moisture resistance, high stability, high oxidization resistance, good electrical and mechanical connection performance and the like, requirements of an existing COG packaging process are met, then it is not needed to change design of the package pins of respective chips in an existing chipset; by using the existing COG packaging process, package of the respective chips on the display panel can be achieved through the connecting board, and therefore packaging process difficulty and cost are reduced, integration density of the packaged chips and devices on the display panel can be greatly improved, and the package structure of the display panel is applicable to a development tendency of lightness, thinness, shortness and smallness of display products and large-scale mass production.

Further, for example, in the above package structure provided by the embodiment of the present disclosure, the convex spot on the side of the connecting board facing the display panel can be a structure with the surface being gold and a center being other metal materials and can also be a structure with both the center and the surface being gold, which is not limited herein.

In order to simplify a manufacturing process and make electrical conductivity, thermal expansion performance and other performance of the convex spot stable, in the above package structure provided by the embodiment of the present disclosure, a material of the convex spot 31 on the side of the connecting board 3 facing the display panel 1 is of gold; that is to say, the convex spot is gold both in the middle and the surface thereof.

For example, in the above package structure provided by the embodiment of the present disclosure, as shown in FIG. 1, generally the package pins 210 of the respective chips 21 in the chipset 2 are electrically connected with the connecting board 3 through convex spots 32 arranged on a side of the connecting board 3 facing away from the display panel 1. Of course, the package pins 210 of the respective chips 21 in the chipset 2 can also be electrically connected with the connecting board 3 in other manners, which is not limited herein.

What needs to be explained is that, in the above package structure provided by the embodiment of the present disclosure, the convex spot can refer to a welding electrode or a package pin or the like, which is not limited herein.

For example, in the above package structure provided by the embodiment of the present disclosure, the connecting board can be a through silicon via (TSV) connecting board; of course, the connecting board can also be connecting boards in other types capable of achieving functions of the connecting board in the embodiment of the present disclosure, for example, a through glass via connecting board and a through ceramic via connecting board, which is not limited herein.

For example, in the above package structure provided by the embodiment of the present disclosure, the connecting board is the TSV connecting board.

Further, for example, the above package structure provided by the embodiment of the present disclosure, as shown in FIG. 1, further includes: an anisotropic conductive adhesive film 4 located between the connecting board 3 and the display panel 1, and the connecting board 3 is electrically connected with the display panel 1 through the anisotropic conductive adhesive film 4.

For example, the convex spots 31 in the connecting board 3 are electrically connected with the package pin 11 of the display panel 1 through the anisotropic conductive adhesive film 4.

Further, for example, in the above package structure provided by the embodiment of the present disclosure, an existing anisotropic conductive film can be adopted as the anisotropic conductive adhesive film 4, which is not described in detail herein.

For example, as shown in FIG. 1, the anisotropic conductive adhesive film 4 mainly includes: an adhesive 41 with an insulating function and conductive particles 42. In a region where the anisotropic conductive film 4 is located between the convex spot 31 of the connecting board 3 and the package pin 11 of the display panel 1 corresponding to the convex spot 31 of the connecting board 3, the conductive particles 42 are in contact with each other, and then the convex spot 31 is electrically connected with the package pin 11; and a region of the anisotropic conductive film 4 not located between a corresponding convex spot 31 and the package pin 11 is not compressed, the conductive particles 42 in this region do not make contact with each other, and thus a conductive effect is not achieved. In this way, the anisotropic conductive film 4 has conductivity in a connection line direction (for example, a vertical direction) of the corresponding convex spot 31 and the package pin 11, while has insulativity in a direction (for example, a horizontal direction) perpendicular to a connection line of the corresponding convex spot 31 and the package pins 11.

Further, for example, a material of the package pin 210 of the chip 21 is generally different from that of the convex spot 32 of the connecting board 3, and thus thermal expansion coefficients are also different. High temperature can be generated when the package pins 210 of the respective chips 21 in the chipset 2 are electrically connected with the convex spots 32 in the connecting board 3; because the package pins 210 and the convex spots 32 are very small and are different in expansion coefficient, a failure of electrical connection may be caused by slight thermal deformation, and fracture of the package pins or the convex spots is caused. In order to guarantee reliability of electrical connection between the package pin 210 and the convex spot 32, the above package structure provided by the embodiment of the present disclosure, as shown in FIG. 1, further includes: bottom filler 5 filled in at least part of a region between the connecting board 3 and the chipset 2.

For example, in order to guarantee reliability of electrical and mechanical connection of the package pins 210 of the respective chips 21 in the chipset 2 and the convex spots 32 of the connecting board 3 to the maximum extent, the bottom filler can be filled in a whole region between the connecting board and the chipset.

Further, for example, in the above package structure provided by the embodiment of the present disclosure, the chipset configured for controlling the display panel at least includes: a driving chip, a storage chip and a power source chip. As well known, in addition to the above chips, other chips for controlling the display panel can be adopted in the display panel, and these chips can be all arranged in the above chipset, which is not limited herein.

Based on a same inventive concept, an embodiment of the present disclosure further provides a package method of a display panel, as shown in FIG. 2, including:

S201: electrically connecting a first side of an connecting board with package pins of respective chips in a chipset configured for controlling the display panel by a reflow soldering process; and S202: electrically connecting a second side of the connecting board opposite to the first side with the display panel by a chip on glass (COG) packaging process, wherein, a material of a surface of a convex spot on the second side of the connecting board is of gold.

In the above package method provided by the embodiment of the present disclosure, because the package pins of the respective chips in the chipset are electrically connected with the connecting board directly, damage to the display panel caused by high temperature generated when the package pins of the respective chips in the chipset are electrically connected with the display panel directly is avoided; because the surface of the convex spot on the second side of the connecting board facing the display panel is of gold which has good characteristics of high electrical conductivity, high temperature resistance, moisture resistance, high stability, high oxidization resistance, good electrical and mechanical connection performance and the like, requirements of an existing COG packaging process are met, then it is not needed to change design of the package pins of various chips in an existing chipset; by adopting the existing COG packaging process, package of the respective chips on the display panel can be achieved through the connecting board, and therefore packaging process difficulty and cost are reduced, integration density of packaging of the chips and devices on the display panel can be greatly improved, and the package method of the display panel is applicable to a development tendency of lightness, thinness, shortness and smallness of display products and large-scale mass production.

For example, the connecting board 3 includes: a connecting substrate and convex spots located on two sides of the connecting substrate, wherein, convex spots on a first side of the connecting substrate are configured for being electrically connected with the package pins of the respective chips in the chipset, and convex spots on a second side of the connecting substrate are configured for being electrically connected with the display panel. The convex spots on the first side of the connecting substrate are electrically connected with the convex spots on the second side of the connecting substrate correspondingly.

Thus, in the above package method provided by the embodiment of the present disclosure, for example, before S201 of electrically connecting the first side of the connecting board with the package pins of respective chips in a chipset for controlling the display panel by a reflow soldering process, the package method further includes:

Forming an array of convex spots corresponding to the package pins of the respective chips in the chipset on the first side of the connecting substrate, and forming an array of convex spots with a gold surface corresponding to package pins of the display panel on the second side of the connecting substrate.

Further, in the above package method provided by the embodiment of the present disclosure, the connecting board can be a through silicon via (TSV) connecting board; of course, the connecting board can also be connecting boards in other types capable of achieving functions of the connecting board in the embodiment of the present disclosure, for example, a through glass via connecting board and a through ceramic via connecting board, which is not limited herein.

Further, for example, a material of the package pins of the chip is generally different from that of the convex spots of the connecting board, and thus thermal expansion coefficients are also different. High temperature can be generated when the package pins of the chips in the chipset are electrically connected with the convex spots in the connecting board; because the package pins and the convex spots are very small and are different in expansion coefficient, a failure of electrical connection may be caused by slight thermal deformation, and fracture of the package pin or the convex spot is caused. In order to guarantee reliability of electrical connection between the package pin and the convex spot, after the S201 of electrically connecting the first side of the connecting board with the package pins of respective chips in the chipset for controlling the display panel, the above package method provided by the embodiment of the present disclosure further includes:

Filling bottom filler between the connecting board and the chipset.

For example, in the above package method provided by the embodiment of the present disclosure, a bottom filling process based on "capillary effect" technology can be adopted to fill the bottom filler between the connecting board and the chipset, which is not limited herein.

Further, for example, in the above package method provided by the embodiment of the present disclosure, for example, the S202 of electrically connecting the second side of the connecting board with the display panel by a chip on glass packaging process can be executed as follows:

Forming an anisotropic conductive film on the second side of the connecting board; or forming an anisotropic conductive film on a side of the display panel facing the connecting board;

Electrically connecting the connecting board with the display panel through the anisotropic conductive film by a hot-pressing process.

For example, in the above package method provided by the embodiment of the present disclosure, a hot-pressing process is adopted to electrically connect the convex spots on the second side of the connecting board with the package pins on the display panel through the anisotropic conductive film.

Based on the same inventive concept, an embodiment of the present disclosure further provides a display device, including the above package structure provided by the embodiment of the present disclosure. The display device can be: a mobile phone, a tablet personal computer, a TV set, a displayer, a notebook computer, a digital photo frame, a navigator or any product or part with a display function. Other essential components of the display device are all components that should be had as understood by those skilled in the art, which is not repeated herein and should not serve as limitation to the embodiment of the present disclosure. Implementation of the display device can refer to the embodiment of the above package structure, which is not repeated any more.

Figure 3B:
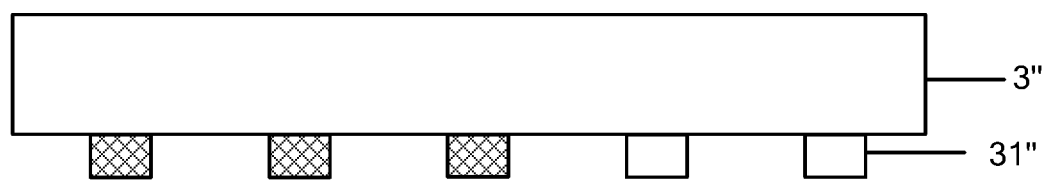

Based on the same inventive concept, an embodiment of the present disclosure further provided a connecting board 3', as shown in FIGS. 3a and 3b, and a surface 310' of a convex spot 31' on at least one side of the connecting board 3' is of gold.

For example, in the connecting board provided by the embodiment of the present disclosure, as shown in FIG. 3b, an overall material of a convex spot 31" of a connecting board 3" is of gold.

Further, for example, in the above package structure provided by the embodiment of the present disclosure, the connecting board can be a through silicon via (TSV) connecting board; of course, the connecting board can also be connecting boards in other types capable of achieving functions of the connecting board in the embodiment of the present disclosure, for example, a through glass via connecting board and a through ceramic via connecting board, which is not limited herein.

The embodiments of the present disclosure provide the package structure of the above display panel, the connecting board, the package method and the display device, the chipset is located above the display panel, and the package pins of respective chips in the chipset are electrically connected with the display panel through the connecting board. Because the package pins of the respective chips in the chipset are electrically connected with the connecting board directly, damage to the display panel caused by high temperature generated when the package pins of the respective chips in the chipset are electrically connected with the display panel directly is avoided; because the surface of the convex spot on one side of the connecting board facing the display panel is of gold and gold has good characteristics of high electrical conductivity, high temperature resistance, moisture resistance, high stability, high oxidization resistance, good electrical and mechanical connection performance and the like, requirements of an existing COG packaging process are met, then it is not needed to change design of the package pins of the respective chips in an existing chipset; by using the existing COG packaging process, package of the respective chips on the display panel can be achieved through the connecting board, and therefore packaging process difficulty and cost are reduced, integration density of packaging of the chips and devices on the display panel can be greatly improved, and the package structure of the above display panel, the connecting board, the package method and the display device are applicable to a development tendency of lightness, thinness, shortness and smallness of display products and large-scale mass production.

Although the embodiment of the disclosure has been described above in great detail with general descriptions and specific embodiments, on the basis of the embodiment of the disclosure, various changes and improvements can be made, which is apparent to those skilled in the art. Therefore, all such changes and improvements without departing from the spirit of the disclosure are within the scope of the claims of the disclosure.

The present application claims priority of Chinese Patent Application No. 201510590867.1 filed on Sep. 16, 2015, the present disclosure of which is incorporated herein by reference in its entirety as part of the present application.

The invention claimed is:

1. A package structure of a display panel, comprising:
a display panel, a chipset configured for controlling the display panel, and a connecting board, wherein
the chipset is located above the display panel, and the connecting board is located between the chipset and the display panel;
the connecting board comprises a connecting substrate and convex spots located on two sides of the connecting substrate, convex spots on a first side of the connecting substrate are electrically connected with the package pins of the respective chips in the chipset, and convex spots on a second side of the connecting substrate are electrically connected with the display panel; and the convex spots on the first side of the connecting substrate are electrically connected with the convex spots on the second side of the connecting substrate correspondingly, and a surface of the convex spots on the second side of the connecting substrate is of gold;
the package pins of respective chips in the chipset are electrically connected with the display panel through the connecting board,
wherein the connection board does not include any driving chip,
a material of the package pin of the chip is different from a material of the convex spot of the connecting board,
the second side of the connecting substrate faces the display panel and the first side of the connection substrate is opposite to the second side of the connecting substrate.

2. The package structure according to claim 1, wherein, the connecting board is a through silicon via connecting board.

3. The package structure according to claim 1, further comprising: an anisotropic conductive film located between the connecting board and the display panel, and the connecting board is electrically connected with the display panel through the anisotropic conductive film.

4. The package structure according to claim 1, further comprising: bottom filler filled in at least part of a region between the connecting board and the chipset.

5. The package structure according to claim 1, wherein, an overall material of the convex spot on the side of the connecting board facing the display panel is of gold.

6. A display device, comprising the package structure of the display panel according to claim 1.

7. A connecting board, wherein, a surface of a convex spot on at least one side of the connecting board is of gold.

8. The connecting board according to claim 7, wherein, an overall material of the convex spot is of gold.

9. A package method of a display panel, comprising:
electrically connecting a first side of an connecting board with package pins of respective chips in a chipset configured for controlling the display panel, by a reflow soldering process; and
electrically connecting a second side of the connecting board with the display panel by a chip on glass packaging process, wherein, a surface of the convex spot on the second side of the connecting board is of gold, wherein the connecting board comprises a connecting substrate and convex spots located on two sides of the connecting substrate, convex spots on the first side of the connecting substrate are electrically connected with the package pins of the respective chips in the chipset, and convex spots on the second side of the connecting substrate are electrically connected with the display panel;
and the convex spots on the first side of the connecting substrate are electrically connected with the convex spots on the second side of the connecting substrate correspondingly,
wherein the connection board does not include any driving chip,
a material of the package pin of the chip is different from a material of the convex spot of the connecting board,
the second side of the connecting substrate faces the display panel and the first side of the connection substrate is opposite to the second side of the connecting substrate.

10. The package method according to claim 9, wherein, the electrically connecting the second side of the connecting board with the display panel by the chip on glass packaging process is executed as:
forming an anisotropic conductive film on the second side of the connecting board; or forming an anisotropic conductive film on a side of the display panel facing the connecting board; and
electrically connecting the connecting board with the display panel through the anisotropic conductive film by a hot-pressing process.

11. The package method according to claim 9, wherein, after electrically connecting a first side of an connecting board with package pins of respective chips in a chipset configured for controlling the display panel, by a reflow soldering process, the package method further comprises:
filling bottom filler between the connecting board and the chipset.

12. The package structure according to claim 2, further comprising: an anisotropic conductive film located between the connecting board and the display panel, and the connecting board is electrically connected with the display panel through the anisotropic conductive film.

13. The package structure according to claim 2, further comprising: bottom filler filled in at least part of a region between the connecting board and the chipset.

14. The package structure according to claim 3, further comprising: bottom filler filled in at least part of a region between the connecting board and the chipset.

15. The package structure according to claim 2, wherein, an overall material of the convex spot on the side of the connecting board facing the display panel is of gold.

16. The package structure according to claim 3, wherein, an overall material of the convex spot on the side of the connecting board facing the display panel is of gold.

17. The package structure according to claim 4, wherein, an overall material of the convex spot on the side of the connecting board facing the display panel is of gold.

18. The package method according to claim 10, wherein, after electrically connecting a first side of an connecting board with package pins of respective chips in a chipset configured for controlling the display panel, by a reflow soldering process, the package method further comprises:
filling bottom filler between the connecting board and the chipset.

* * * * *